United States Patent [19]

McKinnon et al.

[11] Patent Number: 5,034,693

[45] Date of Patent: Jul. 23, 1991

[54] METHOD FOR LOCALIZED NUCLEAR RESONANCE SPECTROSCOPY AND APPARATUS FOR CARRYING OUT THE METHOD

[75] Inventors: Graeme C. McKinnon, Zurich; Peter Bosiger, Ennetbaden, both of Switzerland

[73] Assignee: U.S. Philips Corporation, New York, N.Y.

[21] Appl. No.: 489,422

[22] Filed: Mar. 5, 1990

[30] Foreign Application Priority Data

Mar. 4, 1989 [DE] Fed. Rep. of Germany .... 3906978.8

[51] Int. Cl.$^5$ ............................................. G01R 33/20
[52] U.S. Cl. ..................................................... 324/309
[58] Field of Search ............... 324/300, 307, 309, 310, 324/311, 312, 313, 314, 318, 322; 128/653 A, 653 R

[56] References Cited

U.S. PATENT DOCUMENTS 4,972,148 11/1990 Jensen .................................. 324/309
4,983,920 1/1991 Lampman ........................... 324/309

FOREIGN PATENT DOCUMENTS 0322006 11/1988 European Pat. Off. .

Primary Examiner—Michael J. Tokar
Attorney, Agent, or Firm—William Squire

[57] ABSTRACT

In the presence of a stationary homogeneous magnetic field a number of generated pulse sequences act on an object examination region, of which sequence each sequence comprises three 180° high-frequency pulses following one another at the same temporal interval, which are preceded by at least one high-frequency pulse which produces a transverse magnetization. An apparatus for carrying out the method includes providing an echo time independent of the J-coupling of the object. The first and third of the three 180° high-frequency pulses and the preceding high-frequency pulse are generated as slice-selective pulses, which excite three slices, the second 180° high-frequency pulse is a frequency-selective pulse which is so shaped that it excites only one of two mutually coupled components of the object, and the nuclear resonance signal produced from the sectional area of the three slices is then processed in order to determine its spectrum.

4 Claims, 2 Drawing Sheets

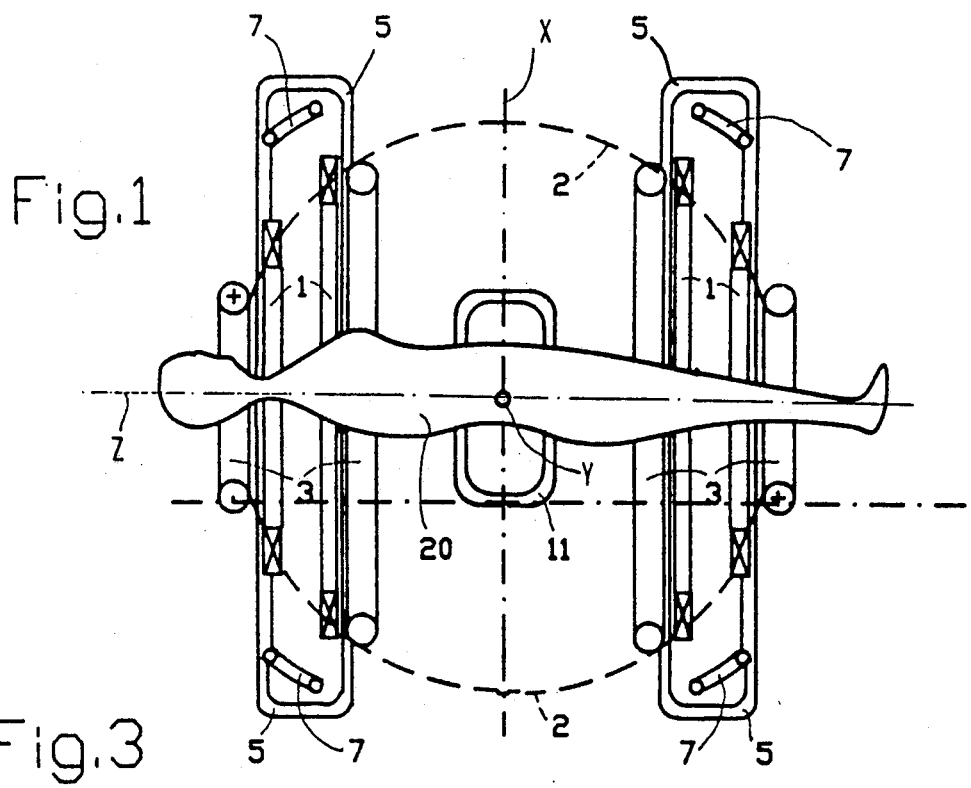
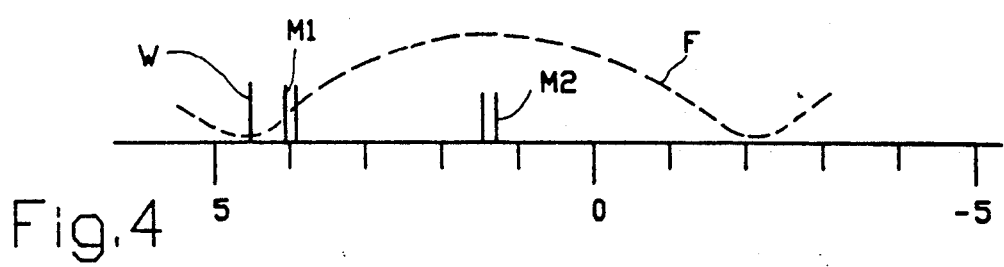
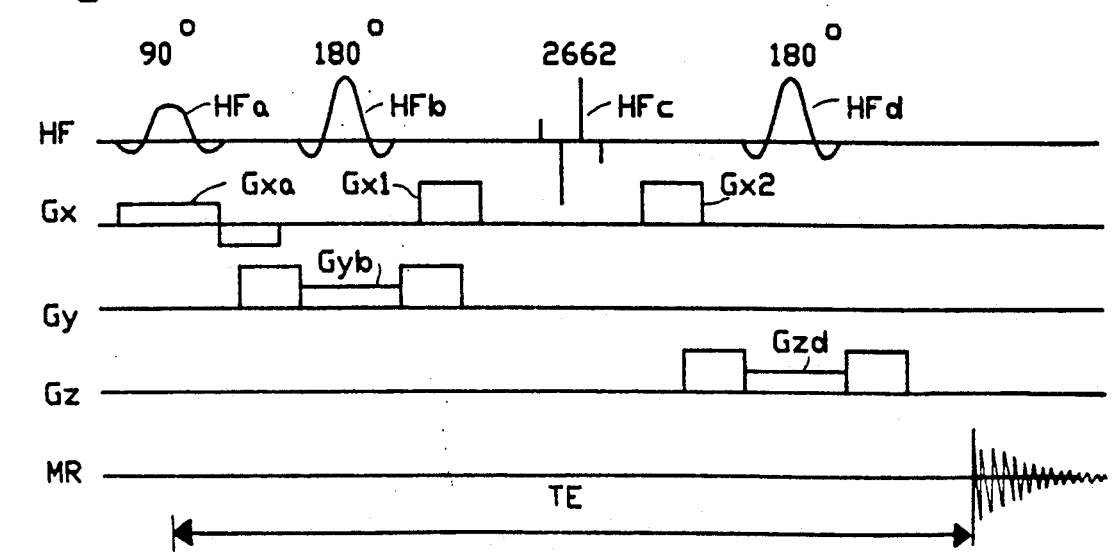

METHOD FOR LOCALIZED NUCLEAR RESONANCE SPECTROSCOPY AND APPARATUS FOR CARRYING OUT THE METHOD

The invention concerns a method for localized nuclear resonance spectroscopy in which in the presence of a stationary homogeneous magnetic field a number of sequences act on an examination region, of which each comprises three 180° high-frequency pulses following one another at the same temporal interval, which are preceded by at least one high-frequency pulse which produces a transverse magnetization.

Of interest is copending application Ser. No. 489,408 filed concurrently herewith in the name of D. J. K. Holz entitled "Nuclear Spin Examination Method and Arrangement for Carrying out the Method" and assigned to the assignee of the present invention.

In this regard, and in what follows, "localized nuclear resonance spectroscopy" is understood to mean determination of the spectrum of nuclear resonance signals from a subregion of an examination region which includes the subregion, for example, from a part of the head of a patient. In the case of such spectroscopic examinations, it is often a matter of detecting materials between whose molecular groups a J-coupling exists. For example, a J-coupling exists between the $CH_3$ group and the CH group of lactic acid. The effect of this J-coupling is that the individual molecular groups do not appear as lines in the nuclear resonance spectrum, but as doublets, whose frequency spacing corresponds to the intensity J of the coupling.

In European Patent Application 322006 which corresponds to U.S. Pat. No. 4,918,387. There is already a description of a method which is suitable for localized spectroscopy, for example, of lactic acid. In this method, each sequence for exciting the nuclear magnetization comprises a 90° pulse, which is followed at the same temporal interval by a 180° pulse and a further 90° pulse. In this regard, the two 90° pulses are frequency-selective. Within a sequence, these three high-frequency pulses are followed by three slice-selective 180° high-frequency pulses, which effect the localization. In a process of this type, the echo time, that is the period between the first high-frequency pulse and the occurrence of the nuclear resonance signal to be processed, must correspond to the value 1/J or a multiple thereof; otherwise, the signal components associated with a doublet are entirely or partially cancelled. Since, in the case of many of the materials mentioned, J is of the order of magnitude of 7 Hz, this means that the echo time must be at approximately 140 ms.

On the one hand, such a time is too long for materials which have a short transverse relaxation time $T_2$. On the other hand, it can, however, also be necessary to choose the echo time even longer in order for the eddy currents, which are generated by the switching on and off of the magnetic gradient fields necessary for the localization, to decrease up to the detection of the nuclear resonance signal.

It is therefore the object of the invention to arrange a method of the type mentioned at the beginning in such a way that the echo time can be chosen independently of the intensity of the J-coupling. This object is achieved according to the invention in that the first and third of the three 180° high-frequency pulses and the preceding high-frequency pulse are slice-selective pulses, which excite three slices, in that the second 180° high-frequency pulse is a frequency-selective pulse which is so shaped that it excites only one of the two mutually coupled components of a material, and in that the nuclear resonance signal from the sectional area of the three slices is processed in order to determine its spectrum.

In the case of the invention, at least a first high-frequency pulse is generated which is slice-selective and produces a transverse magnetization in the slice, preferably a 90° high-frequency pulse. This is followed by three 180° high-frequency pulses, of which the first and third are slice-selective, while the second is frequency-selective and excites only one of the two components of the material to be detected.

For one component in the sectional area of the three slices, the frequency-selective 180° high-frequency pulse has a refocusing effect, so that the effect of the J-coupling on the nuclear magnetization associated with this component is neutralized at an instant whose temporal interval from the frequency-selective pulse corresponds to its interval from the preceding slice-selective high-frequency pulse. Consequently, the nuclear resonance signal must be acquired at this instant or at around this instant. The echo time resulting herefrom can be accommodated to the requirements by appropriate choice of the temporal interval between the preceding pulse and the three 180° high-frequency pulses; it is independent of the J-coupling.

The frequency-selective 180° high-frequency pulse does not influence the other component of the material. This component therefore exerts no influence on the nuclear resonance signal generated in the sectional area of the three slices.

The invention is explained in more detail below with reference to the drawings, wherein FIG. 1 shows an apparatus with which the process according to the invention can be carried out;

FIG. 3 shows the location of the spectral components of water and lactic acid; and FIG. 4 shows the temporal course of a sequence.

Figure 2:
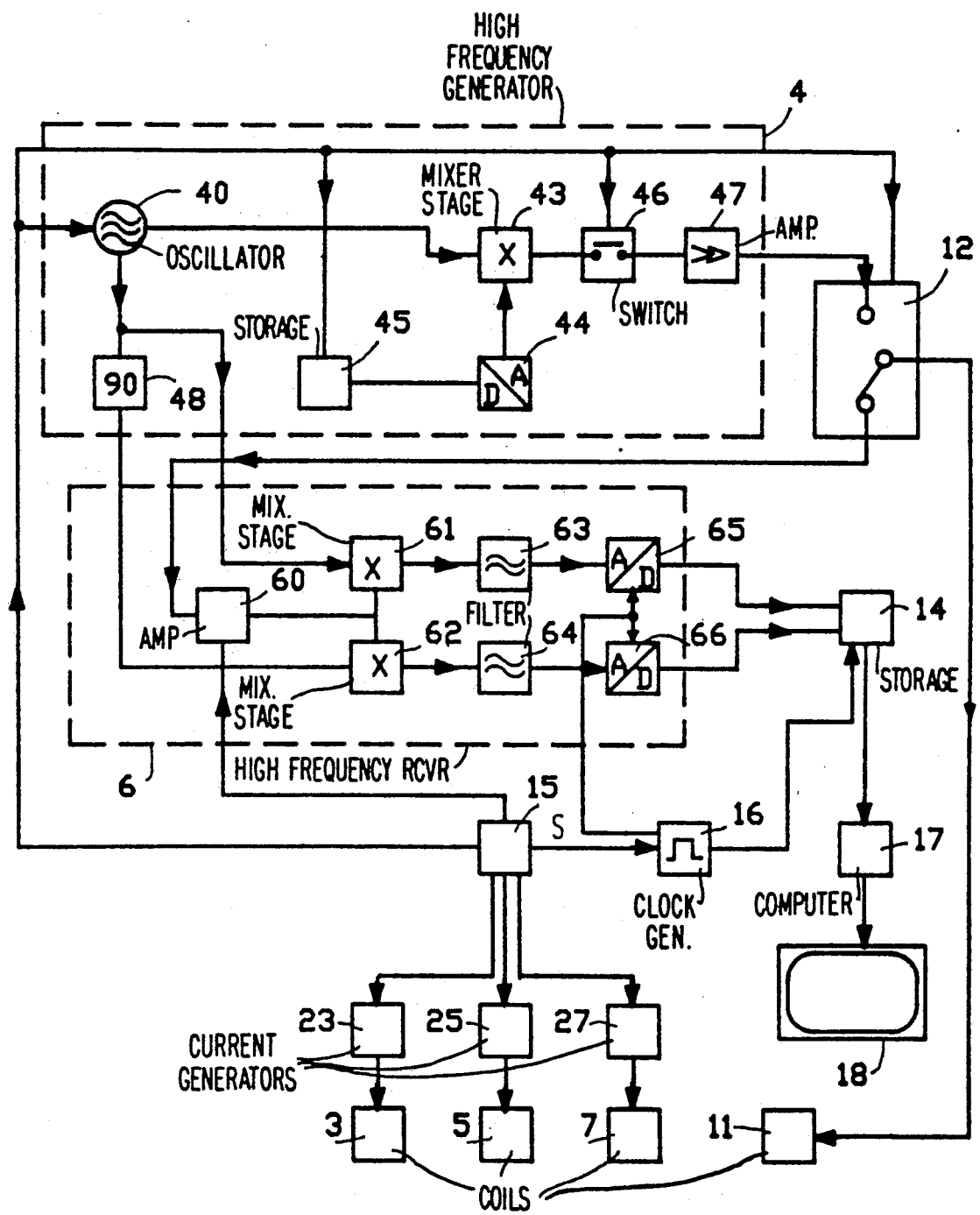
FIG. 2 shows a block diagram of such an apparatus.

The nuclear spin examination apparatus represented diagrammatically in FIG. 1 contains an arrangement consisting of four coils 1 for generating a homogeneous stationary magnetic field, which can be of the order of magnitude of a few tenths of a tesla to a few teslas. This field extends in the z-direction of a Cartesian coordinate system. The coils 1 arranged concentrically with the z-axis can be arranged on a spherical surface 2. The patient 20 to be examined is situated in the interior of these coils.

Four coils 3 are preferably arranged on the same spherical surface in order to generate a magnetic field Gz extending in the z-direction and changing linearly in this direction. Furthermore, four coils 7 are provided which generate a magnetic gradient field Gx likewise extending in the z-direction, (that is a magnetic field whose strength varies linearly in one direction), whose gradient extends, however, in the x-direction. A magnetic gradient field Gy extending in the z-direction with a gradient in the y-direction is generated by four coils 5, which can be identical to the coils 7, but are arranged displaced spatially with respect to the latter by 90°. Only two of these four coils are represented in FIG. 1.

Since each of the three coil arrangements 3, 5 and 7 for generating the magnetic gradient fields Gz, Gy, Gx is arranged symmetrically to the spherical surface 2, the field strength in the centre of the sphere, which simultaneously forms the origin of coordinates of the Cartesian x-y-z-coordinate system mentioned, is determined only by the stationary homogeneous magnetic field of the coil arrangement 1.

Furthermore, a high-frequency coil 11 is arranged symmetrically to the plane z=0 of the coordinate system, which is constructed in such a way that in this way an essentially homogeneous high-frequency magnetic field is generated which extends in the x-direction, i.e. perpendicular to the direction of the stationary homogeneous magnetic field. During each high-frequency pulse, a high-frequency current, in general amplitude-modulated, is fed to the high-frequency coil by a high-frequency generator. Following upon the three high-frequency pulses of each component sequence, the high-frequency coil 11 serves to receive the nuclear resonance signal generated in the examination region. However, instead of this it is also possible to use a separate high-frequency receiving coil.

FIG. 2 shows a simplified block diagram of this nuclear spin examination apparatus. The high-frequency coil 11 is connected via a switchover device 12 to a high-frequency generator 4, on the one hand, and a high-frequency receiver 6, on the other hand.

The high-frequency generator 4 contains a high-frequency oscillator 40, which can be controlled digitally in its frequency by a control dence 15 and which, in the case of the field strength generated by the coils 1 exhibits oscillations with a frequency in the region of the Larmor frequency of the atomic nuclei to be excited. The Larmor frequency f is computed, as is known, according to the relationship f=cB, B representing the magnetic induction in the stationary homogeneous magnetic field and c the gyromagnetic ratio, which for protons, for example, amounts to 42.56 MHz/T. The output of the oscillator 40 is connected to an input of a mixer stage 43. A second input signal is fed to the mixer stage 43 by a digital-to-analog converter 44, whose output is connected to a digital storage 45. Controlled by the control device 15, a series of digital data words which represent an envelope signal is read out from the storage 45.

The mixer stage 43 processes the input signals fed to it in such a way that a carrier modulated with an envelope signal appears at its output. The output signal of the mixer stage 43 is fed via a switch 46 controlled by the control device 15 to a high-frequency power amplifier 47, whose output is connected to the switchover device 12. The latter is likewise controlled by the control device 15.

The receiver 6 contains a high-frequency amplifier 60, which is connected to the switchover device and to which the stimulated echo signal induced in each case in the high-frequency coil 11 is fed, it being necessary for the switchover device 12 to have the appropriate switching state. The amplifier 60 possesses a mute switch input which is controlled by the control device 15 and via which it can be disabled, so that the amplification is practically zero. The output of the amplifier is connected to the first inputs of two multiplicative mixer stages 61 and 62, which each deliver an output signal corresponding to the product of the input signals. A signal is fed to the two inputs of the mixer stages 61 and 62 with the frequency of the oscillator 40, a phase shift of 90° existing between the signals at the two inputs. This phase shift is generated with the aid of a 90° phase shifting element 48, whose output is connected to the input of the mixer stage 62, and whose input is connected to the input of the mixer stage 61 and to the output of the oscillator 40.

The output signals of the mixer stages 61 and 62 are respectively fed to analog-to-digital converters 65 and 66 via respective low-pass filters 63 and 64. Filters 63 and 64 suppress the frequencies applied by the oscillator 40 and all frequencies lying thereabove, and pass low-frequency components. The converters 65 and 66 convert the analog signals of the circuits 61 . . . 64, which form a quadrature demodulator, into digital data words, which are fed to a storage 14. The analog-to-digital converters 65 and 66, and the storage 14 receive their clock pulses from a clock pulse generator 16, which can be disabled or enabled via a control line by the control device 15, so that it is only in a measurement interval defined by the control device 15 that the signals supplied by the high-frequency coil 11 and transposed into the low-frequency range can be converted into a series of digital data words and stored in the storage 14. The data words or sample values stored in the storage 14 are fed to a computer 17, which determines the spectral distribution of the nuclear magnetization therefrom by means of a discrete Fourier transformation, and outputs the determined distribution to a suitable display unit, e.g. a monitor 18.

The arrangements of gradient coils 3, 5 and 7 are supplied by current generators 23, 25 and 27 in each case with a current whose temporal variation can be controlled by the control device 15.

FIG. 3 shows the position of the components essential for the clinical detection of lactic acid on a frequency scale which specifies the deviation from the Larmor frequency of TMS (tetramethylsilane) (in ppm). The Larmor frequency of TMS thus lies at zero in accordance with definition, while the Larmor frequency W of water lies at 4.7 ppm. The doublet M2 of the $CH_3$ group of lactic acid (lactate) lies at 1.3 ppm, while the doublet of CH group contained in lactic acid, which thereby interacts via a J-coupling, lies at 4.1 ppm.

In FIG. 4, the HF line represents the temporal position of the high-frequency pulses, the Gx, Gy and Gz lines represent the respective temporal position of the magnetic gradient fields Gx, Gy and Gz, and MR line represents the nuclear resonance signal which is used to determine the spectrum.

The sequence begins with a 90° high-frequency pulse HFa, which is accompanied by a magnetic gradient field Gxa whose gradient extends in the x-direction. The high-frequency pulse HFa is thus a slice-selective high-frequency pulse, through which a transverse magnetization is generated in a slice whose position is determined by the centre frequency of the high-frequency pulse HFa and whose thickness is determined by the bandwidth and by the magnitude of the gradient of the magnetic gradient field.

The high-frequency pulse HFa is followed by a 180° high-frequency pulse HFb, which is accompanied by a magnetic gradient field Gy having a gradient extending in the y-direction. This high-frequency pulse therefore influences a slice which is perpendicular to the y-axis and to the slice excited by the first high-frequency pulse. It inverts the nuclear magnetization inside this slice. The magnetic gradient field Gyb accompanying it moreover has the effect that the nuclear magnetization in the first slice—insofar as it does not simultaneously lie in the second slice—is dephased.

There then follows a 180° high-frequency pulse HFc, which is shaped as a frequency-selective pulse and excites only one of the two components M1, M2 of the lactic acic, preferably the lactic acid component M2 produced by the CH$_3$ group, while it does not influence the other component. Such a high-frequency pulse can be achieved as a so-called binomial high-frequency pulse, for example a 2662 high-frequency pulse. It is known that a binomial high-frequency pulse consists of a series of component pulses whose associated flip angles (that is the angle by which the nuclear magnetization is tilted from the position of rest by such a pulse), bear the same relationship to one another as the binomial coefficients, each component pulse rotating the nuclear magnetization with the same or opposite direction of rotation as the preceding component pulse. The centre frequency of the component pulses must correspond to the Larmor frequency of the lactic acid component M2 or M1 - dependinq upon whether the component pulses following one another have the same or the opposite phase angle. The temporal interval between the two component pulses must be chosen so that the phase angle of the component (M1) not to be excited varies from component pulse to component pulse by precisely 180° (or an odd multiple thereof). For this purpose, the temporal interval between two component pulses must correspond in each case to the half of the reciprocal of the frequency difference between the two components M1 and M2.

This frequency difference amounts per se to only approximately 180 Hz (if the induction flux density generated by the coils 1 amounts to 1.5 tesla), but it is expedient to set the frequency difference between M2 and the Larmor frequency of protons bonded to water (approximately 217 Hz), because thereby a better suppression of the water components contained in the signal, and the still sufficient suppression of the component M1 is achieved. This corresponds to a temporal interval of the component pulses of approximately 2.3 ms.

After the frequency-selective high-frequency pulse HFd there follows a slice-selective 180° high-frequency pulse HFb, whose interval from the high-frequency pulse HFc is precisely as large as the interval between HFb and HFc (computed in each case from the middle of these pulses). The current generator 23 is switched on during this high-frequency pulse, so that the coils 3 generate a magnetic gradient field Gzd with a gradient extending in the z-direction. In this way, influence is exerted on the nuclear magnetization inside a slice which extends perpendicular to the z-axis and perpendicular to the slices influenced by the high-frequency pulses HFa and HFb. Subsequently, a transverse nuclear magnetization exists only in the sectional area of the three named slices. The effect of the frequency-selective high-frequency pulse HFc, in conjunction with the remaining high-frequency pulses on the nuclear magnetization in the sectional area depends upon the Larmor frequency of the particular component.

The nuclear magnetization of the CH$_3$ group M2 of lactic acid, which group is contained in the sectional area, is refocused by the high-frequency pulse HFc. The magnetic gradient field, whose gradient extends in the x-direction, and which is switched on between HFb and HFc (Gx1) and between HFc and HFd, in such a way that the time integral over the gradients in the two intervals is equal and the high-frequency pulse HFc lies precisely in the middle, does not influence these components. Thus, the three high-frequency pulses HFb, HFc and HFd act for the component M2 in the sectional area of the three slices like a single 180° high-frequency pulse and the echo signal generated in conjunction with the first high-frequency pulse HFa has its maximum at an instant whose temporal interval from the pulse HFc corresponds to the temporal interval from the pulse HFa. The echo time TE is thus twice as large as the interval between HFa and HFc, and thus independent of the intensity of the J-coupling. It can therefore be accommodated to the diagnostic requirements.

The component M1 of lactic acid contained in the sectional area, and the water component do not "see" the frequency-selective high frequency HFc. The nuclear magnetization of these components is therefore not rephased, so that these components do not make a contribution to the nuclear resonance signal (MR line of FIG. 4). The second high-frequency pulse HFc thus acts like a (periodic) filter, whose characteristic F is indicated by dashes in FIG. 3.

After the high-frequency pulse HFb, and after all magnetic gradient fields have been switched off, the spectrometer is switched to receive, for example by bringing the change-over switch 12 into the position shown in the drawing. At the same time, the control device 15 enables the clock generator 16, so that the nuclear resonance signal received and transposed into the low frequency range is converted into a series of digital data words, which are stored in the storage 14. Since the signal-to-noise ratio of the nuclear resonance signal produced in a single sequence is not sufficient, the sequence—after a suitably chosen repetition time, in each case—is periodically repeated and the digitized nuclear resonance signals are summed until a suitable signal-to-noise ratio is achieved. Subsequently, the frequency spectrum is determined in the computer 17 from the sum of the nuclear resonance signals by Fourier transformation.

It has been assumed above that the three 180° high-frequency pulses HFb. . . HFd are preceded by only a single high-frequency pulse (HFa). However, inside a sequence it is also possible for a plurality of high-frequency pulses to precede, of which the last must be slice-selective and may not be frequency-selective; this last pulse ought to tilt the nuclear magnetization by 90° in the slice which is influenced by it.

What is claimed is:

1. A method for localized nuclear resonance spectroscopy comprising producing a nuclear resonance signal by causing in the presence of a stationary homogeneous magnetic field a number of signal sequences to act on three slices of an examination region of a sectional area of an object, of which sequences each sequence comprises three 180° high-frequency pulses following one another at the same temporal interval, which are preceded by at least one high-frequency pulse which produces a transverse magnetization, wherein the first and third occurring of the three 180° high-frequency pulses and the preceding high-frequency pulse are slice-selective pulses, which excite said three slices, in that the second 180° high-frequency pulse is a frequency-selective pulse which is so shaped that it excites only one of two mutually coupled components of a material of said object, and processing the nuclear resonance signal produced from the sectional area of the three slices in order to determine its spectrum.

2. A method according to claim 1 including shaping the second 180° high-frequency pulse so that it excites the CH$_3$ group of lactic acid and does not excite the protons bonded to water in order to detect lactic acid.

3. A method according to one of claims 1 or 2 including switching on and off a magnetic gradient field in the interval between the first and the second occurring pulses and in the interval between the second and the third occurring 180° high-frequency pulses, which field is so shaped that the time integral over the gradient of this field is the same in both intervals.

4. Apparatus for localized nuclear resonance spectroscopy comprising coil means for generating a homogeneous stationary magnetic field, said coil means including a high-frequency coil arrangement for generating a sequence of high-frequency pulses and for receiving a sequence of nuclear resonance signals generated as a reaction thereto in the examination region of an object, said coil means comprising gradient coils for generating magnetic gradient fields having gradients extending in different directions, a processing unit for deriving a spectrum from the nuclear resonance signals received, and a control device for generating at least one signal sequence in which sequence a first object slice-selective high-frequency pulse is followed by three 180° pulses of which the first and third occurring pulses are slice-selective and the second occurring pulse is frequency-selective.

* * * * *